(12) United States Patent
Prushinskiy et al.

(10) Patent No.: US 9,431,502 B2
(45) Date of Patent: Aug. 30, 2016

(54) DISPLAY PANEL AND DISPLAY APPARATUS HAVING THE SAME

(71) Applicant: SAMSUNG DISPLAY CO., LTD., Yongin, Gyeonggi-Do (KR)

(72) Inventors: Valeriy Prushinskiy, Hwaseong-si (KR); Min-Soo Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 142 days.

(21) Appl. No.: 14/158,109

(22) Filed: Jan. 17, 2014

(65) Prior Publication Data
US 2014/0319555 A1  Oct. 30, 2014

(30) Foreign Application Priority Data
Apr. 30, 2013  (KR) .................. 10-2013-0048304

(51) Int. Cl.
| | | |
|---|---|---|
| *H01L 29/205* | (2006.01) | |
| *H01L 33/00* | (2010.01) | |
| *H01L 29/49* | (2006.01) | |
| *H01L 29/423* | (2006.01) | |

(52) U.S. Cl.
CPC ..... *H01L 29/4908* (2013.01); *H01L 29/42384* (2013.01)

(58) Field of Classification Search
CPC .................................................. H01L 27/1244
USPC ............................................................ 257/91
See application file for complete search history.

(56) References Cited

U.S. PATENT DOCUMENTS

| | | | |
|---|---|---|---|
| 7,279,711 B1* | 10/2007 | Yamazaki | H01L 29/42384 257/344 |
| 2003/0169381 A1* | 9/2003 | Kawachi et al. | 349/43 |
| 2003/0194839 A1* | 10/2003 | Chung | H01L 29/66772 438/151 |
| 2005/0199878 A1* | 9/2005 | Arao et al. | 257/66 |
| 2006/0132461 A1* | 6/2006 | Furukawa et al. | 345/173 |
| 2006/0254704 A1* | 11/2006 | Seo et al. | 156/249 |
| 2009/0200609 A1 | 8/2009 | Miyasaka et al. | |
| 2009/0237582 A1* | 9/2009 | Kakkad | G02F 1/134363 349/46 |
| 2010/0245735 A1* | 9/2010 | Xie | G02F 1/136286 349/110 |

FOREIGN PATENT DOCUMENTS

| | | |
|---|---|---|
| KR | 1020040044755 | 5/2004 |
| KR | 1020040056665 | 7/2004 |
| KR | 1020090086341 | 8/2009 |

* cited by examiner

*Primary Examiner* — Matthew Landau
*Assistant Examiner* — Igwe U Anya
(74) *Attorney, Agent, or Firm* — F. Chau & Associates, LLC (57) ABSTRACT

A display panel includes a substrate, an active layer, a gate insulating layer, a gate electrode structure, an insulating interlayer, a switching element, and a planarization insulating layer. The active layer includes a source region and a drain region, and is disposed on the substrate. The gate insulating layer is disposed on the active layer. The gate electrode structure includes a plurality of gate electrode layer which are at least partially overlapped with each other. The gate electrode structure is disposed on the gate insulating layer. The insulating interlayer covers the gate electrode structure. The switching element includes a source electrode and a drain electrode, and the source electrode and the drain electrode are in contact with the source region and the drain region, respectively. The planarization insulating layer covers the switching element.

23 Claims, 4 Drawing Sheets

DISPLAY PANEL AND DISPLAY APPARATUS HAVING THE SAME

CROSS REFERENCE TO RELATED APPLICATION

This application claims priority under 35 U.S.C. §119 to Korean Patent Application No. 10-2013-0048304 filed on Apr. 30, 2013, the disclosure of which is hereby incorporated by reference herein in its entirety.

TECHNICAL FIELD

Example embodiments of the inventive concept relate to a display panel and display apparatus having the display panel. More particularly, example embodiments of the inventive concept relate to a display panel having an electrode complex and display apparatus having the display panel.

DISCUSSION OF THE RELATED ART

Conventional displays typically include, for example, a flat display of a glass based or a metal foil material. For example, the flat panel display may be a liquid crystal display (LCD), a plasma display panel (PDP) or an organic light emitting display (OLED).

The flat display is mainly processed on rigid substrate, e.g., glass, to be manufactured. However, a rigid display may have difficulties associated therewith such as that these displays may not be very flexible. Recently, a flexible display having a flexible substrate instead of conventional glass substrate has been developed.

The flexible substrate can be classified into, for example, a thin film glass substrate, a metal foil substrate and a plastic substrate. The plastic substrate is widely used in various display apparatuses. The plastic substrate can be manufactured through, for example, a roll to roll process.

However, most of the plastic substrates do not have a high temperature resistance. Accordingly, the substrate may be readily deformed. In addition, because the flexible substrate is light and thin, an element may not be directly manufactured on the flexible substrate.

Thus, a method of safely placing the element on the flexible substrate has been studied. In one of these methods, after the flexible substrate is disposed on a rigid carrier to be manufactured, the flexible substrate is then removed from the rigid carrier.

In this case, safely removing the flexible substrate without damaging the apparatus is desired. However, during a delaminating process, the flexible substrate can be bent downwardly, so that elements disposed on the substrate may be damaged.

SUMMARY

Example embodiments provide a display panel preventing damage to an element disposed on a substrate in a delaminating process of a flexible display apparatus.

Example embodiments provide a display apparatus having the display panel.

According to an example embodiment, a display panel includes a substrate, an active layer, a gate insulating layer, a gate electrode structure, an insulating interlayer, a switching element, and a planarization insulation layer. The active layer includes a source region and a drain region, and is disposed on the substrate. The gate insulating layer is disposed on the active layer. The gate electrode structure includes a plurality of gate electrode layers which are at least partially overlapped with each other. The gate electrode structure is disposed on the gate insulating layer. The insulating interlayer covers the gate electrode structure. The switching element includes a source electrode and a drain electrode, in which the source electrode and the drain electrode are in contact with the source region and the drain region, respectively. The planarization insulating layer covers the switching element.

In an example embodiment, the gate electrode structure may include a first gate electrode layer and a second gate electrode layer, and the first gate electrode layer and the second gate electrode layer may be disposed on the gate insulating layer.

In an example embodiment, the second gate electrode layer may be disposed on the first gate electrode layer, and a width of the first gate electrode layer may be different from a width of the second gate electrode layer.

In an example embodiment, the second gate electrode layer may partially cover the first gate electrode layer.

In an example embodiment, the second gate electrode layer may cover opposing side portions of the first gate electrode layer.

In an example embodiment, the second gate electrode layer may include at least two continuous sub gate electrode layers.

In an example embodiment, the first gate electrode layer may be formed on the gate insulating layer, the first gate electrode layer may include a first sub gate electrode layer and a second sub gate electrode layer, and the first sub gate electrode layer may be spaced apart from the second sub gate electrode layer on the gate insulating layer, and the second gate electrode layer partially may cover the first sub gate electrode layer and the second sub gate electrode layer, the second gate electrode layer may include a third sub gate electrode layer and a fourth sub gate electrode layer, and the third sub gate electrode layer may be spaced apart from the fourth sub gate electrode layer.

In an example embodiment, the first gate electrode layer may be disposed on the gate insulating layer, and the first gate electrode layer may include at least two continuous sub gate electrode layers.

In an example embodiment, the first gate electrode layer may include a substantially zigzag shape, and the second gate electrode layer may partially cover a center of the first gate electrode layer.

In an example embodiment, the first gate electrode layer may include at least three continuous sub gate electrode layers.

In an example embodiment, the first gate electrode layer may include a substantially W shape, and the second gate electrode layer may partially cover a center of the first gate electrode layer.

In an embodiment, a height of the first gate electrode layer may be substantially the same as a height of the second gate electrode layer, and a taper angle of the first gate electrode layer and the second gate electrode layer may include a substantially round shape.

According to an example embodiment, a display apparatus includes a first substrate, an insulating layer, a switching element, an insulating interlayer, a first electrode, an emitting structure, and a second electrode. The insulating layer is disposed on the first substrate. The switching element includes a gate electrode structure having a plurality of gate electrode layers which are at least partially overlapped with each other. The insulating interlayer covers the switching element. The first electrode is disposed on the insulating interlayer. The emitting structure is disposed on the first electrode. The second electrode is disposed on the emitting structure.

In an example embodiment, the gate electrode structure may include a first gate electrode layer and a second gate electrode layer, and the first gate electrode layer and the second gate electrode layer may be disposed on the gate insulating layer.

In an example embodiment, the second gate electrode layer may be disposed on the first gate electrode layer, and the second gate electrode layer may partially expose the first gate electrode layer.

In an example embodiment, the first gate electrode structure may include a first gate electrode layer and a second gate electrode layer, and the first gate electrode layer may be spaced apart from the second gate electrode layer on the gate insulating layer, and the second gate electrode layer partially may expose the first sub gate electrode layer and the second sub gate electrode layer, and the second gate electrode layer may include a third sub gate electrode layer and a fourth sub gate electrode layer, and the third sub gate electrode layer may be spaced apart from the fourth sub gate electrode layer.

In an example embodiment, the first gate electrode layer may include at least two continuous sub gate electrode layers.

In an example embodiment, the first gate electrode layer substantially may include a substantially zigzag shape, and the second gate electrode layer may partially cover a center of the first gate electrode layer.

In the present example embodiment, the first gate electrode layer may include at least three continuous sub gate electrode layers.

In an example embodiment, the first gate electrode layer may include a substantially W shape, and the second gate electrode layer may partially cover a center of the first gate electrode layer.

In an example embodiment, a height of the first gate electrode layer may be substantially the same as a height of the second gate electrode layer, and a taper angle of the first gate electrode layer and the second gate electrode layer may include a substantially round shape.

In accordance with an example embodiment, a display apparatus is provided. The display apparatus includes a first substrate formed of a rigid material, an insulating layer disposed on the first substrate, a switching element disposed on the insulating layer. The switching element includes a flexible substrate, an active layer including a source region and a drain region, in which the active layer is disposed on the flexible substrate, a gate insulating layer disposed on the active layer, a gate electrode structure including a plurality of gate electrode layers at least partially overlapped with each other, in which the gate electrode structure is disposed on the gate insulating layer, an insulating interlayer covering the gate electrode structure, and a source electrode and a drain electrode each disposed on the insulating interlayer. The source electrode and the drain electrode each penetrate the insulating interlayer and the gate insulating layer thereby contacting with the source region of the active layer and the drain region of the active layer, respectively.

In addition, the display apparatus further includes a planarization insulating layer disposed on the insulating interlayer, the source electrode and the drain electrode, in which the planarization insulating layer includes a contact hole exposing the drain electrode, a first electrode disposed the planarization insulating layer, wherein the first electrode is electrically connected to the drain electrode through the contact hole in the planarization insulating layer, a pixel definition layer disposed on the planarization insulating layer and partially covering the first electrode, an organic layer disposed on the first electrode and a second electrode covering the organic layer and the pixel definition layer.

According to the display panel and the display apparatus of example embodiments, when the gate electrode structure has the at least two gate electrode layers, the display apparatus may prevent damage caused by an outward force. Also, the flexible apparatus has the electrode structure, so that elements disposed on the substrate may not be damaged during the delamination of the flexible display apparatus.

BRIEF DESCRIPTION OF THE DRAWINGS

Example embodiments can be understood in more detail from the following description taken in conjunction with the accompanying drawings, in which.

DESCRIPTION OF EXAMPLE EMBODIMENTS

Example embodiments are described more fully hereinafter with reference to the accompanying drawings. Example embodiments of the inventive concept may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like or similar reference numerals refer to like or similar elements throughout. As used herein, the term "and/or" includes any and all combinations of one or more of the associated listed items.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
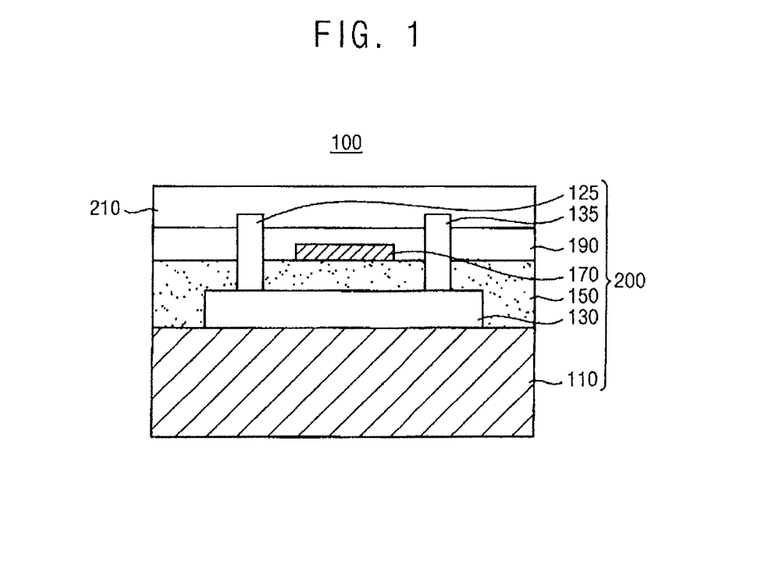
FIG. 1 is a cross-sectional view illustrating a display panel in accordance with an example embodiment of the present invention.

FIG. 1 is a cross-sectional view illustrating a display panel in accordance with an example embodiment of the present invention.

Referring to FIG. 1, the display panel 100 includes, for example, a switching element 200 and a planarization insulating layer 210. The switching element 200 includes, for example, a substrate 110, an active layer 130, a gate insulating layer 150, a gate electrode structure 170, an insulating interlayer 190, a source electrode 125 and a drain electrode 135.

Referring again to FIG. 1, the substrate 110 includes, for example, a flexible substrate. For example, the substrate 110 may include a metal foil (such as, e.g., stainless steel (SUS), titanium (Ti), molybdenum (Mo), an Inconel alloy, or Kovar) or a plastic substrate (lighter than a glass substrate). Examples of the plastic material for the flexible plastic substrate include but are not limited to polyethylene terephthalate (PET), polyethylene naphthalate (PEN), polyethersulfone (PES), polyimide (PI), polyetherimide (PEI), polystyrene (PS), polyvinyl chloride (PVC), polyethylen (PE), polypropylene (PP), or nylon (Ny). In addition, the substrate 110 may further include an insulating layer (not shown).

The insulating layer may be disposed on the substrate 110, and includes an insulating material. The insulating material may include, for example, inorganic insulating materials (for example, silicon oxide (SiOx), silicon nitride (SiNx), silicon oxynitride (SiOxNy), silicon oxycarbide (SiOxCy), silicon carbon nitride (SiCxNy), etc.). The inorganic insulating materials can be used alone, in combination with each other, as mixtures thereof, or in a laminated structure. When the insulating layer includes a laminated structure, the insulating layer may be formed, for example, in a multi layer structure (for example, SiOx layer, SiNx layer, SiOxNy layer, SiOxCy layer, SiCxNy layer). The insulating layer prevents the diffusion of a metal atom or impurities from the substrate 110. In addition, the insulating layer may planarize a surface of substrate 110.

The active layer 130 is disposed on the substrate 110. In the present example embodiment, the active layer 130 may include, for example, amorphous silicon, poly silicon and organic semiconductor materials. The active layer 130 may include, for example, a drain contact contacting the drain electrode 135 of a thin film transistor, a source contact contacting a source electrode of the thin film transistor and a channel is disposed between the drain contact and the source contact (not shown).

When the gate insulating layer 150 is disposed on the active layer 130, the active layer 130, the gate electrode structure 170 and a gate line are electrically insulated. The gate insulating layer 150 may include, for example, a silicon oxide (SiOx), a silicon nitride (SiNx), a silicon oxynitride (SiOxNy), a metal oxide, a metal nitride, and/or a metal oxynitride. For example, the metal oxide may include hafnium oxide (HfOx), aluminum oxide (AlOx), zirconium oxide (ZrOx), titanium oxide (TiOx), tantalum oxide (TaOx), yttrium oxide (Y2O3), barium titanate (BaTiO3), and/or lead titanate (PbTiO3). The metal nitride may include, for example, aluminum nitride (AlN). In addition, the metal oynitride may include, for example, aluminum oxynitride (AlNO). The above-mentioned materials of the gate insulating layer 150 may be used alone, in combination with each other, as mixtures thereof, or in a laminated structure. The gate insulating layer 150 includes, for example, the source contact of the active layer 130 and a contact hole exposing a drain contact.

The gate electrode structure 170 is disposed on the gate insulating layer 150. The gate electrode structure 170 is disposed on the channel of the active layer 130. When the voltage difference generates between the gate electrode structure 170 and source electrode 125, the thin film transistor is turned on, and the current may flow into the drain electrode 135 through the channel.

The gate electrode structure 170 may include, for example, metals, alloys, metal nitrides, conductive metal oxides, and/or transparent conductive materials. For example, the gate electrode structure 170 may include aluminum (Al), aluminum-containing alloys, aluminum nitride (AlNx), silver (Ag), an alloy containing silver, tungsten (W), tungsten nitride (WNx), copper (Cu), copper-containing alloys, nickel (Ni), chromium (Cr), chromium nitride (CrNx), molybdenum (Mo), molybdenum-containing alloys, titanium (Ti), titanium nitride (TiNx), platinum (Pt), palladium (Pd), gold (Au), iridium (Ir), rhodium (Rh), osmium (Os), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. In addition, the gate electrode structure 170 may include, for example, a metal film, an alloy film, a metal nitride film, a conductive metal oxide layer and a transparent conductive material layer. The above-mentioned materials for the gate electrode structure 170 can be used alone, in combination with each other, as mixtures thereof, or in a laminated structure.

The gate insulating layer 150 and the gate electrode structure 170 is formed, for example, on same layer, and the gate insulating layer 150 is electrically connected with the gate electrode structure 170.

The insulating interlayer 190 is formed on the gate electrode structure 170 and the gate insulating layer 150. The gate electrode structure 170, the gate line (not shown), the source electrode 125 and the drain electrode 135 are insulated by insulating interlayer 190.

The insulating interlayer 190 may include, for example, silicon compounds. For example, the insulating interlayer 190 may include SiOx, SiNx, SiOxNy, SiOxCy, SiCxNy etc. The above-mentioned materials for the insulating interlayer 190 can be used alone, in combination with each other, or as mixtures thereof. The insulating interlayer 190 includes, for example, the source of the active layer 130 and the contact holes exposing the drain.

The source electrode 125 and drain electrode 135 are disposed on the insulating interlayer 190. As the source electrode 125 and drain electrode 135 penetrate the contact holes, the source electrode 125 and drain electrode 135 contact with the source region of the active layer 130 and the drain region of the active layer 130, respectively.

The source electrode 125 and the drain electrode 135 may be formed using, for example, metals, alloys, metal nitrides, conductive metal oxides, and/or transparent conductive materials. For example, the source electrode 125 and the drain electrode 135 may include aluminum (Al), aluminum-containing alloys, aluminum nitride (AlNx), silver (Ag), an alloy containing silver, tungsten (W), tungsten nitride (WNx), copper (Cu), copper-containing alloys, nickel (Ni), chromium (Cr), chromium nitride (CrNx), molybdenum (Mo), molybdenum-containing alloys, titanium (Ti), titanium nitride (TiNx), platinum (Pt), palladium (Pd), gold (Au), iridium (Ir), rhodium (Rh), osmium (Os), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. The above-mentioned materials for the source electrode 125 and the drain electrode 135 can be used alone, in combination with each other, as mixtures thereof, or in a laminated structure.

The data line (not shown), the source electrode 125 and drain electrode 135 is formed, for example, in the same layer, and the data line and the source electrode 125 are electrically connected to each other.

When the planarization insulating layer 210 is formed on the source electrode 125, the drain electrode 135 and the insulating interlayer 190, the source electrode 125 and anode electrode (not shown) are insulated.

The planarization insulating layer 210 may include, for example, a photoresist, an acrylic resin, a polyimide resin, a polyamide resin, a siloxane resin, a photosensitive acrylic containing a carboxyl resin, a novolac resin, an alkali-soluble resin, SiOx, SiNx, SiOxNy, SiOxCy, SiCxNy etc. The above-mentioned materials for the planarization insulating layer can be used alone, in combination with each other or as mixtures thereof. The planarization insulating layer 210 includes, for example, the contact hole exposing a drain electrode 135. A first electrode (which will be described in more detail in connection with FIG. 8) is disposed on the planarization insulating layer 210, and electrically is connected with the drain electrode 135 through the contact hole of the planarization insulating layer 210.

Figure 2:
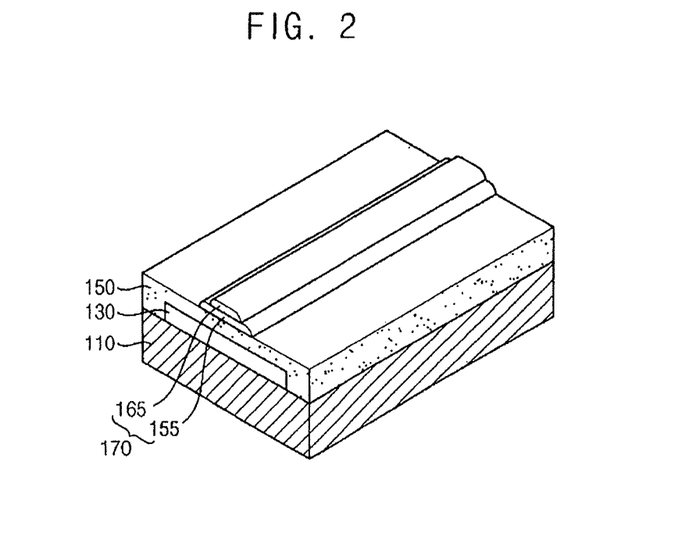
FIGS. 2 to 7 are perspective views illustrating a display panel in accordance with an example embodiment of the present invention.

FIGS. 2 to 7 are perspective views illustrating a display panel in accordance with an example embodiment of the present invention. FIG. 2 is perspective views illustrating a switching element of a display panel in accordance with an example embodiment of the present invention.

Referring to FIG. 1 and FIG. 2, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 2, the gate electrode structure 170 is formed on the gate insulating layer 150. The gate electrode structure 170 may include, for example, a first gate electrode layer 155 and a second gate electrode layer 165.

For example, in the present example embodiment, a width of the first gate electrode layer 155 which is formed on the gate insulating layer 150 is longer than a width of the second gate electrode layer 165 which formed on the first gate electrode layer 155, and a height of the first gate electrode layer 155 is the same as a height of the second gate electrode layer 165. In addition, a taper angle of the first gate electrode layer 155 and the second gate electrode layer 165 may include a substantially round shape.

Accordingly, when the gate electrode structure 170 has at least two gate electrode layers, the flexibility of the switching element 200 may be increased.

Figure 3:
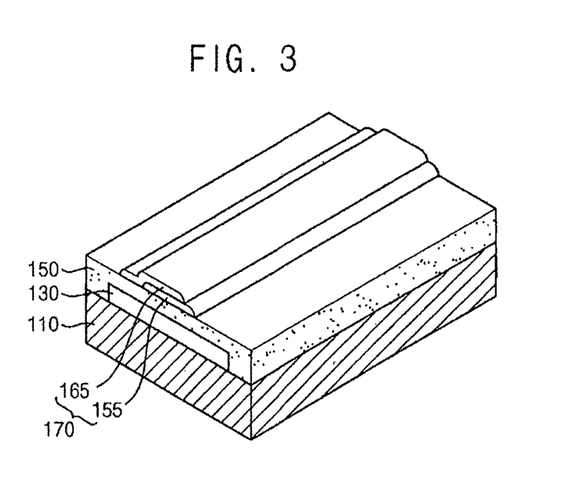

FIG. 3 is a perspective view illustrating a switching element of a display panel in accordance with an example embodiment of the present invention.

Referring to FIG. 1 and FIG. 3, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 3, the gate electrode structure 170 is formed on the gate insulating layer 150. The gate electrode structure 170 may include, for example, a first gate electrode layer 155 and a second gate electrode layer 165.

In the present example embodiment, the second gate electrode layer 165 partially covers the first gate electrode layer 155. A width and a height of the first gate electrode layer 155 are, for example, the same as a width and a height of the second gate electrode layer 165. In addition, a taper angle of the first gate electrode layer 155 and the second gate electrode layer 165 may include, for example, a substantially round shape.

Accordingly, when the gate electrode structure 170 has at least two gate electrode layers, the flexibility of the switching element 200 may be increased.

Figure 4:
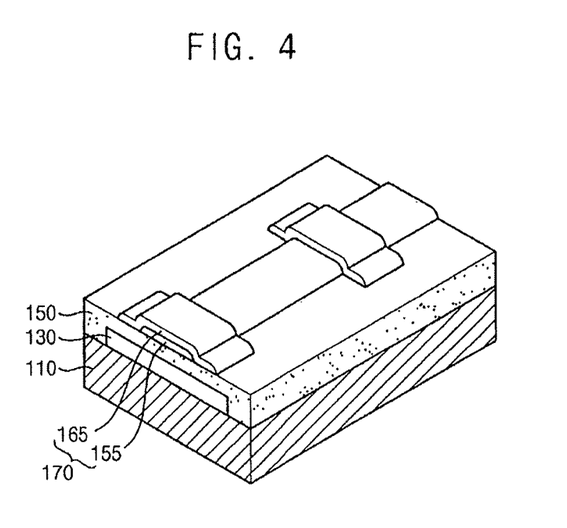

FIG. 4 is a perspective view illustrating a switching element of a display panel in accordance with an example embodiment of the present invention.

Referring to FIG. 1 and FIG. 4, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 4, the gate electrode structure 170 is formed on the gate insulating layer 150. The gate electrode structure 170 may include, for example, a first gate electrode layer 155 and a second gate electrode layer 165. In this case, the second gate electrode layer 165 may further include, for example, two sub gate electrode layers.

For example, in the present example embodiment, the two sub gate electrode layers are formed on the first gate electrode layer 155, and may cover both side portions of the first gate electrode layer 155. In addition, a height of the first gate electrode layer 155 may be, for example, the same as a height of the second gate electrode layer 165. A taper angle of the first gate electrode layer 155 and the second gate electrode layer 165 may include, for example, a substantially round shape.

In an example embodiment, the gate electrode structure 170 is formed on the gate insulating layer 150. The gate electrode structure 170 may include the first gate electrode layer 155 and the second gate electrode layer 165. In this embodiment, the second gate electrode layer 165 may further include, for example, at least two sub gate electrode layers. The at least two sub gate electrode layers are formed on, for example, the first gate electrode layer 155, and are spaced apart from each other, and continuously, may cover a portion of the first gate electrode layer 155.

Accordingly, when the gate electrode structure 170 has at least two gate electrode layers, the flexibility of the switching element 200 may be increased.

Figure 5:
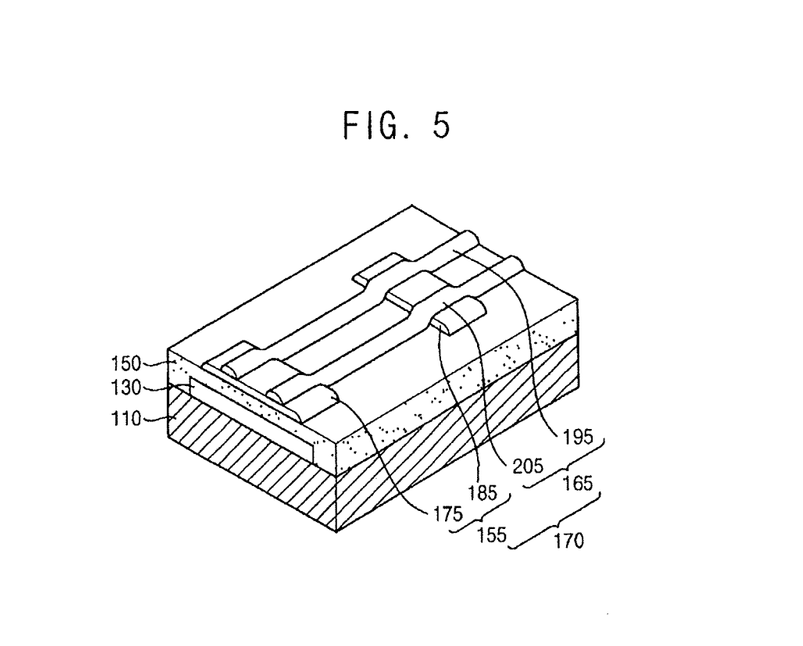

FIG. 5 is a perspective view illustrating a switching element of a display panel in accordance with an example embodiment of the present invention.

Referring to FIG. 1 and FIG. 5, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 5, the gate electrode structure 170 is formed on the gate insulating layer 150. The gate electrode structure 170 may include, for example, a first gate electrode layer 155 and a second gate electrode layer 165. In this embodiment, the first gate electrode layer 155 may further include, for example, a first sub gate electrode layer 175 and a second sub gate electrode layer 185, and the second gate electrode layer 165 may further include, for example, a third sub gate electrode layer 195 and a fourth sub gate electrode layer 205. The first sub gate electrode layer 175 and the second sub gate electrode layer 185 are formed, for example, on the gate insulating layer 150, and are spaced apart from each other. The third sub gate electrode layer 195 and the fourth sub gate electrode layer 205, for example, partially cover the first sub gate electrode layer 175 and the second sub gate electrode layer 185, and are spaced apart from each other. In addition, a height of the first gate electrode layer 155 is, for example, the same as a height of the second gate electrode layer 165. A taper angle of the first gate electrode layer 155 and the second gate electrode layer 165 may include, for example, a substantially round shape.

In an example embodiment, the gate electrode structure 170 is formed on the gate insulating layer 150. The gate electrode structure 170 may include the first gate electrode layer 155 and the second gate electrode layer 165. In this embodiment, the first gate electrode layer 155 may further include, for example, at least two sub gate electrode layers, and the second gate electrode layer 165 may further include, for example, the third sub gate electrode layer 195 and the fourth sub gate electrode layer 205. The at least two sub gate electrode layers are, for example, continuously formed under the second gate electrode layer 165, and are spaced apart from each other.

Accordingly, when the gate electrode structure 170 has at least two gate electrode layers, the flexibility of the switching element 200 may be increased.

Figure 6:
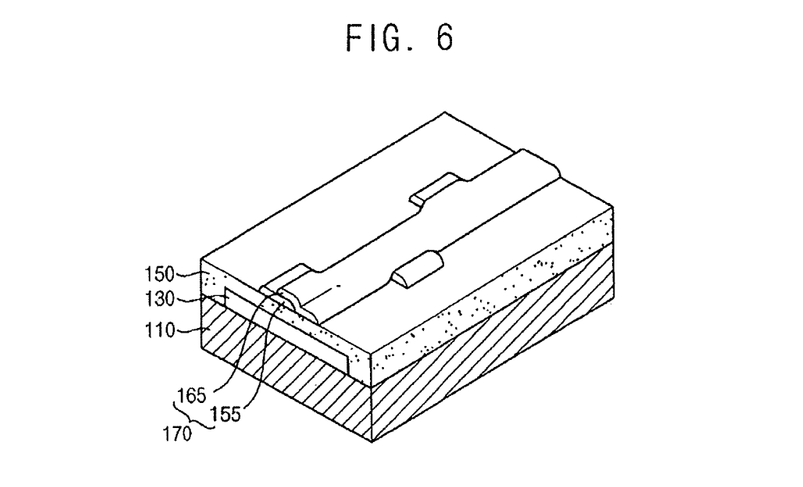

FIG. 6 is a perspective view illustrating a switching element of a display panel in accordance with an example embodiment of the present invention.

Referring to FIG. 1 and FIG. 6, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 6, the gate electrode structure 170 is formed on the gate insulating layer 150. The gate electrode structure 170 may include, for example, a first gate electrode layer 155 and a second gate electrode layer 165. In this embodiment, the first gate electrode layer 155 may further include, for example, three sub gate electrode layers. In the present example embodiment, the first gate electrode layer 155 includes, for example, a substantially zigzag shape, and the second gate electrode layer 165 formed on the first gate electrode layer 155, for example, partially covers a center of the first gate electrode layer 155. In addition, a height of the first gate electrode layer 155 is, for example, the same as a height of the second gate electrode layer 165. A taper angle of the first gate electrode layer 155 and the second gate electrode layer 165 may include, for example, a substantially round shape.

In an example embodiment, the gate electrode structure 170 is formed on the gate insulating layer 150. The gate electrode structure 170 may include the first gate electrode layer 155 and the second gate electrode layer 165. In this embodiment, the first gate electrode layer 155 may further include, for example, at least three sub gate electrode layers. The at least three sub gate electrode layers include, for example a substantially zigzag shape, and are continuously formed. The second gate electrode layer 165 is, for example, formed on the first gate electrode layer 155 and partially covers a center of the first gate electrode layer 155.

Accordingly, when the gate electrode structure 170 has at least two gate electrode layers, the flexibility of the switching element 200 may be increased.

Figure 7:
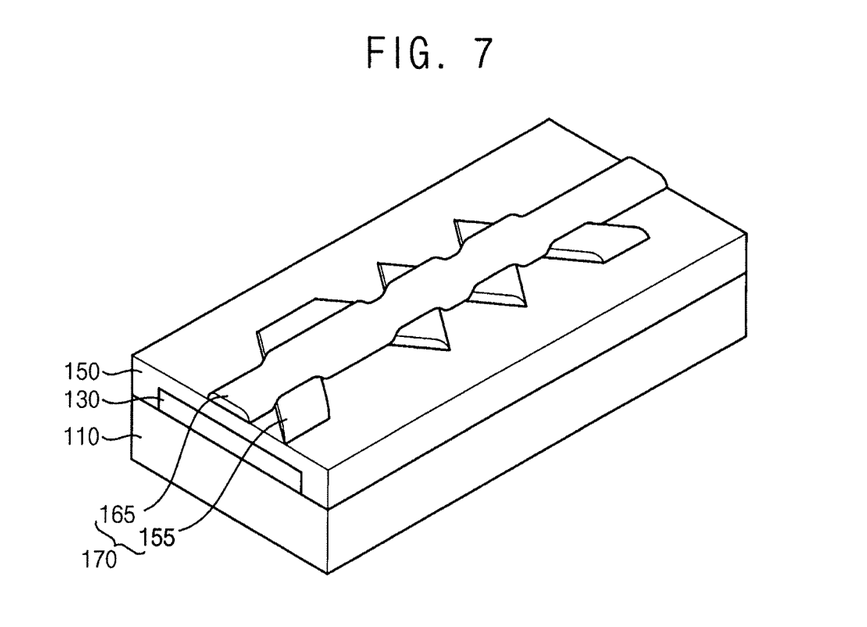

FIG. 7 is perspective views illustrating a switching element of a display panel in accordance with an example embodiment of the present invention.

Referring to FIG. 1 and FIG. 7, a switching element 200 includes, for example, a substrate 110, an active layer 130, a gate insulating layer 150, a gate electrode structure 170, an insulating interlayer 190, a source electrode 125 and a drain electrode 135. The substrate 110, the active layer 130, the gate insulating layer 150, the insulating interlayer 190, the source electrode 125 and the drain electrode 135 have already been explained in connection with FIG. 1, and thus any further repetitive explanation concerning the above elements will be omitted.

Referring again to FIG. 7, the gate electrode structure 170 is formed on the gate insulating layer 150. The gate electrode structure 170 may include a first gate electrode layer 155 and a second gate electrode layer 165. In the present example embodiment, the first gate electrode layer 155 includes, for example, a substantially W shape, and the second gate electrode layer 165 may, for example, partially cover a center of the first gate electrode layer. In addition, a height of the first gate electrode layer 155 is, for example, the same as a height of the second gate electrode layer 165. A taper angle of the first gate electrode layer 155 and the second gate electrode layer 165 may include, for example, a substantially round shape.

Accordingly, when the gate electrode structure 170 has at least two gate electrode layers, the flexibility of the switching element 200 may be increased.

Figure 8:
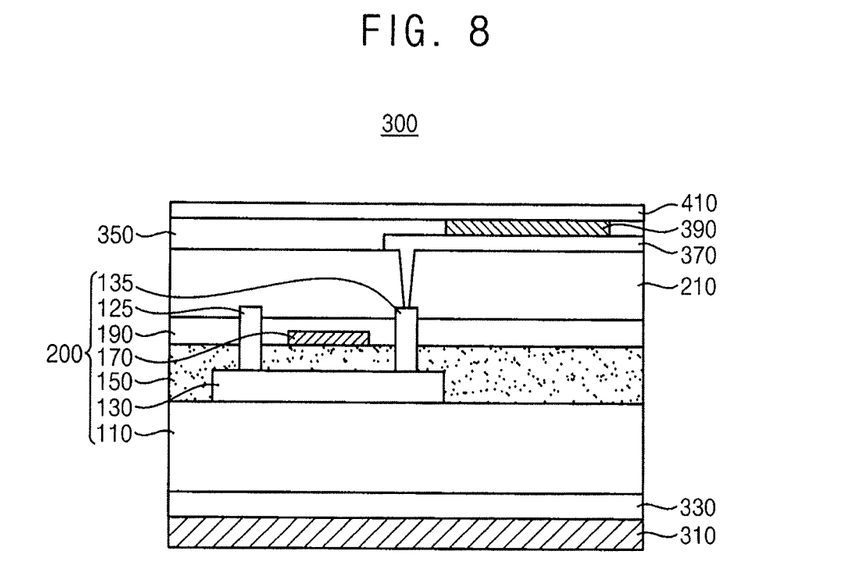
FIG. 8 is a cross-sectional view illustrating a display apparatus in accordance with an example embodiment of the present invention.

FIG. 8 is a cross-sectional view illustrating a display apparatus in accordance with an example embodiment of the present invention.

Referring to FIG. 8, the display apparatus 300 may include, for example, a first substrate 310, an insulating layer 330, a switching element 200, a planarization insulating layer 210, a first electrode 370, a pixel definition layer 350, an organic layer 390 and a second electrode 410.

Referring again to FIG. 8, the first substrate 310 includes, for example, a support substrate. For example, the first substrate 310 may include a substrate of rigid materials such as glass, quartz, wafers, ceramic, metal, or a metal oxide. For example, the substrate 110 is flexible, and the switching element 200 on the substrate 110 can be directly formed. Thus, for example, the first substrate 310 of the rigid materials is formed, and the insulating layer 330 is formed on the first substrate 310, and the switching element 200 is formed on insulating layer 330. In a delaminating process, the first substrate 310 and the substrate 110 may be separated.

The insulating layer 330 is formed on the first substrate 310. In the present example embodiment, the insulating layer 330 may include, for example, an isolation layer. For example, in the delaminating process, separating the first substrate 310 and the substrate 110 may include, for example, a method of irradiating a laser beam in the insulating layer 330, using chemical dissolution and directly separating the first substrate 310 from the substrate 110 using a knife. In the method of being directly separated by a knife, for example, a top position is disposed in the first substrate 310, and a bottom position is disposed in the substrate 110. For example, when substrate 110 separates from the first substrate 310, the substrate 110, which is flexible, is bent downward by gravity, and an element disposed on the substrate 110 can be transformed.

The switching element 200 may include, for example, the substrate 110, an active layer 130, a gate insulating layer 150, a gate electrode structure 170, an insulating interlayer 190, a source electrode 125 and a drain electrode 135.

The substrate 110 includes, for example, a flexible substrate. For example, the substrate 110 may include a metal foil (such as, e.g., stainless steel (SUS), titanium (Ti), molybdenum (Mo) an Inconel alloy, or Kovar) or a plastic substrate (lighter than a glass substrate). Examples of the plastic material for the flexible plastic substrate include but are not limited to polyethylene terephthalate (PET), polyethylene naphthalate (PEN), polyethersulfone (PES), polyimide (PI), polyetherimide (PEI), polystyrene (PS), polyvinyl chloride (PVC), polyethylen (PE), polypropylene (PP), or nylon (Ny). In addition, the substrate 110 may further include, for example, an insulating layer (not shown).

The insulating layer may be disposed on the substrate 110, and includes an insulating material. The insulating material may include, for example, inorganic insulating materials (for example, SiOx, SiNx, SiOxNy, SiOxCy, SiCxNy etc.). The inorganic insulating materials can be used alone, in combination with each other, as mixtures thereof, or in a laminated structure. When the insulating layer includes a laminated structure, the insulating layer may be formed, for example, in a multi layer structure (for example, SiOx layer, SiNx layer, SiOxNy layer, SiOxCy layer, SiCxNy layer). The insulating layer prevents the diffusion of a metal atom or impurities from the substrate 110. In addition, the insulating layer may planarize a surface of substrate 110.

The active layer 130 is disposed on the substrate 110. In the present example embodiment, the active layer 130 may include, for example, amorphous silicon, poly silicon and organic semiconductor materials. The active layer 130 may include, for example, a drain contact contacting the drain electrode 135 of a thin film transistor, a source contact contacting a source electrode of the thin film transistor and a channel is disposed between the drain contact and the source contact (not shown).

When the gate insulating layer 150 is disposed on the active layer 130, the active layer 130, the gate electrode structure 170 and a gate line are electrically insulated. The gate insulating layer 150 may include, for example, a silicon oxide (SiOx), a silicon nitride (SiNx), a silicon oxynitride (SiOxNy), a metal oxide, a metal nitride, and/or a metal oxynitride. For example, the metal oxide may include hafnium oxide (HfOx), aluminum oxide (AlOx), zirconium oxide (ZrOx), titanium oxide (TiOx), tantalum oxide (TaOx), yttrium oxide (Y2O3), barium titanate (BaTiO3), and/or lead titanate (PbTiO3). The metal nitride may include, for example, aluminum nitride (AlN). In addition, the metal oynitride may include, for example, aluminum oxynitride (AlNO). The above-mentioned materials for the gate insulating layer 150 may be used alone, in combination with each other, as mixtures thereof, or in a laminated structure. The gate insulating layer 150 includes, for example, the source contact of the active layer 130 and a contact hole exposing a drain contact.

The gate electrode structure 170 is disposed on the gate insulating layer 150. The gate electrode structure 170 is disposed on the channel of the active layer 130. When a voltage difference generates between the gate electrode structure 170 and source electrode 125, the thin film transistor is turned on, and the current may flow into the drain electrode 135 through the channel.

The gate electrode structure 170 may include, for example, metals, alloys, metal nitrides, conductive metal oxides, and/or transparent conductive materials. For example, the gate electrode structure 170 may include aluminum (Al), aluminum-containing alloys, aluminum nitride (AlNx), silver (Ag), an alloy containing silver, tungsten (W), tungsten nitride (WNx), copper (Cu), copper-containing alloys, nickel (Ni), chromium (Cr), chromium nitride (CrNx), molybdenum (Mo), molybdenum-containing alloys, titanium (Ti), titanium nitride (TiNx), platinum (Pt), palladium (Pd), gold (Au), iridium (Ir), rhodium (Rh), osmium (Os), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. In addition, the gate electrode structure 170 may include, for example, a metal film, an alloy film, a metal nitride film, a conductive metal oxide layer and a transparent conductive material layer. The above-mentioned materials for the gate electrode structure 170 can be used alone, in combination with each other, as mixtures thereof, or in a laminated structure.

The gate insulating layer 150 and the gate electrode structure 170 are formed on, for example, the same layer, and the gate insulating layer 150 is electrically connected with the gate electrode structure 170.

The insulating interlayer 190 is formed on the gate electrode structure 170 and the gate insulating layer 150. The gate electrode structure 170, the gate line (not shown), the source electrode 125 and the drain electrode 135 are insulated by insulating interlayer 190.

The insulating interlayer 190 may include, for example, silicon compounds. For example, the insulating interlayer 190 may include SiOx, SiNx, SiOxNy, SiOxCy, SiCxNy etc. The above-mentioned materials for the insulating interlayer 190 can be used alone, in combination with each other or as mixtures thereof. The insulating interlayer 190 includes, for example, the source of the active layer 130 and the contact holes exposing the drain.

The source electrode 125 and drain electrode 135 are disposed on the insulating interlayer 190. As the source electrode 125 and drain electrode 135 penetrate the contact holes, the source electrode 125 and drain electrode 135 contact with the source region of the active layer 130 and the drain region of the active layer 130, respectively.

The source electrode 125 and the drain electrode 135 may be formed using, for example, metals, alloys, metal nitrides, conductive metal oxides, and/or transparent conductive materials. For example, the source electrode 125 and the drain electrode 135 may include aluminum (Al), aluminum-containing alloys, aluminum nitride (AlNx), silver (Ag), an alloy containing silver, tungsten (W), tungsten nitride (WNx), copper (Cu), copper-containing alloys, nickel (Ni), chromium (Cr), chromium nitride (CrNx), molybdenum (Mo), molybdenum-containing alloys, titanium (Ti), titanium nitride (TiNx), platinum (Pt), palladium (Pd), gold (Au), iridium (Ir), rhodium (Rh), osmium (Os), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. The above-mentioned materials for the source electrode 125 and the drain electrode 135 can be used alone, in combination with each other, as mixtures thereof, or in a laminated structure.

The data line (not shown), the source electrode 125 and drain electrode 135 are formed, for example, in same layer, and the data line and the source electrode 125 are electrically connected to each other.

When the planarization insulating layer 210 is formed on the source electrode 125, the drain electrode 135 and the insulating interlayer 190, the source electrode 125 and anode electrode (not shown) are insulated.

The planarization insulating layer 210 may include, for example, a photoresist, an acrylic resin, a polyimide resin, a polyamide resin, a siloxane resin, a photosensitive acrylic containing carboxyl resin, a novolac resin, an alkali-soluble resin, SiOx, SiNx, SiOxNy, SiOxCy, SiCxNy etc. The materials for the planarization insulating layer 210 can be used alone, in combination with each other or as mixtures thereof. The planarization insulating layer 210 includes, for example, a contact hole exposing a drain electrode 135. The first electrode 370 is, for example, disposed on the planarization insulating layer 210, and is electrically connected with the drain electrode 135 through contact hole of the planarization insulating layer 210.

When the display apparatus 300 is a top emission type, the first electrode 370 formed may, include, for example, a metal having reflectivity or an alloy having reflectivity. For example, the first electrode 370 may include aluminum (Al), aluminum-containing alloys, aluminum nitride (AlNx), silver (Ag), an alloy containing silver, tungsten (W), tungsten nitride (WNx), copper (Cu), copper-containing alloys, nickel (Ni), chromium (Cr), chromium nitride (CrNx), molybdenum (Mo), molybdenum-containing alloys, titanium (Ti), titanium nitride (TiNx), platinum (Pt), palladium (Pd), gold (Au), iridium (Ir), rhodium (Rh), osmium (Os), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. In addition, the first electrode 370 may include a metal film, alloy film, a metal nitride film, a conductive metal oxide layer and a transparent conductive material layer. The above-mentioned materials for the first electrode 370 can be used alone, in combination with each other, or as mixtures thereof.

The pixel definition layer 350 is, for example, formed on the planarization insulating layer 210, and partially exposes the first electrode 370. The pixel definition layer 350 may include, for example, organic or inorganic materials. For example, the pixel definition layer 350 may include a photoresist, an acrylic resin, a polyimide resin, SiOx etc. A display region and a peripheral region of display apparatus 300 are defined by the pixel definition layer 350. For example, the first electrode 370 is exposed by the pixel definition layer 350, and the exposed region of the first electrode 370 is the display region.

For example, the organic layer 390 is formed on the first electrode 370, and the second electrode 410 covers the organic layer 390 and the pixel definition layer 350.

When the display apparatus 300 is a top emission type, the second electrode 410 may include, for example, transparent conductive materials such as zinc oxide (ZnOx), indium tin oxide (ITO), tin oxide (SnOx), indium oxide (InOx), gallium oxide (GaOx), indium zinc oxide (IZO), aluminum doped zinc oxide (AZO), cadmium zinc oxide (CZO), indium gallium zinc oxide (IGZO), etc. The above-mentioned materials for the second electrode 410 can be used alone, in combination with each other, or as mixtures thereof.

Accordingly, when the gate electrode structure 170 has at least two gate electrode layers, the flexibility of the switching element 300 may be increased. Thus, in the delaminating process, a transformation of an element disposed on the substrate 110 can be prevented.

Having described example embodiments of the present invention, it is further noted that it is readily apparent to those of ordinary skill in the art that various modifications may be made without departing from the spirit and scope of the invention which is defined by the metes and bounds of the appended claims.

What is claimed is:
1. A display panel, comprising:
a switching element including:
  a flexible substrate;
  an active layer including a source region and a drain region, wherein the active layer is disposed on the substrate;
  a gate insulating layer disposed on the active layer;
  a gate electrode structure including a plurality of gate electrode layers only partially overlapped with each other, wherein the gate electrode structure is disposed on the gate insulating layer;
  an insulating interlayer covering the gate electrode structure; and
  a source electrode and a drain electrode, wherein the source electrode is in contact with the source region, and wherein the drain electrode is in contact with the drain region; and
a planarization insulating layer covering the switching element,
wherein the gate electrode structure comprises a first gate electrode layer and a second gate electrode layer that is in direct contact with the first gate electrode layer, and
wherein the second gate electrode layer is disposed on the first gate electrode layer, and the second gate electrode layer partially exposes the first gate electrode layer.

2. The display panel of claim 1, wherein the second gate electrode layer exposes opposing side portions of the first gate electrode layer.

3. The display panel of claim 1, wherein a width of the first gate electrode layer is different from a width of the second gate electrode layer.

4. The display panel of claim 1, wherein the first gate electrode layer is disposed on the gate insulating layer, and the first gate electrode layer comprises a first sub gate electrode layer and a second sub gate electrode layer, wherein the first sub gate electrode layer is spaced apart from the second sub gate electrode layer on the gate insulating layer, and the second gate electrode layer partially covers the first sub gate electrode layer and the second sub gate electrode layer, wherein the second gate electrode layer comprises a third sub gate electrode layer and a fourth sub gate electrode layer, and wherein the third sub gate electrode layer is spaced apart from the fourth sub gate electrode layer.

5. The display panel of claim 4, wherein the first gate electrode layer is disposed on the gate insulating layer, and wherein the first gate electrode layer comprises at least two continuous sub gate electrode layers.

6. The display panel of claim 1, wherein the first gate electrode layer comprises a substantially zigzag shape, and wherein the second gate electrode layer partially covers a center of the first gate electrode layer.

7. The display panel of claim 6, wherein the first gate electrode layer comprises at least three continuous sub gate electrode layers.

8. The display panel of claim 1, wherein the first gate electrode layer comprises a substantially W shape, and wherein the second gate electrode layer partially covers a center of the first gate electrode layer.

9. The display panel of claim 1, wherein a height of the first gate electrode layer is the same as a height of the second gate electrode layer, and a taper angle of the first gate electrode layer and the second gate electrode layer comprises a substantially round shape.

10. A display apparatus, comprising:
a switching element comprising a flexible substrate, an active layer disposed on the flexible substrate, a gate insulating layer disposed on the active layer, a gate electrode structure having a plurality of gate electrode layers partially overlapped with each other on the gate insulating layer, an insulating interlayer covering the gate electrode structure, and source and drain electrodes on the insulating interlayer;
a planarization insulating layer covering the switching element;
a first electrode disposed on the insulating interlayer;
an emitting structure disposed on the first electrode; and
a second electrode disposed on the emitting structure,
wherein the gate electrode structure comprises a first gate electrode layer and a second gate electrode layer that is in direct contact with the first gate electrode layer, and
wherein the second gate electrode layer is disposed on the first gate electrode layer and wherein the second gate electrode layer partially exposes the first gate electrode layer.

11. The display apparatus of claim 10, wherein the the second gate electrode layer exposes opposing side portions of the first gate electrode layer.

12. The display apparatus of claim 10, wherein the first gate electrode layer comprises a first sub gate electrode layer and a second sub gate electrode layer, wherein the first sub gate electrode layer is spaced apart from the second sub gate electrode layer on the insulating layer, wherein the second gate electrode layer partially covers the first sub gate electrode layer and the second sub gate electrode layer, wherein the second gate electrode layer comprises a third sub gate electrode layer and a fourth sub gate electrode layer, and wherein the third sub gate electrode layer is spaced apart from the fourth sub gate electrode layer.

13. The display apparatus of claim 12, wherein the first gate electrode layer comprises at least two continuous sub gate electrode layers.

14. The display apparatus of claim 10, wherein the first gate electrode layer comprises a substantially zigzag shape, and wherein the second gate electrode layer partially covers a center of the first gate electrode layer.

15. The display apparatus of claim 14, wherein the first gate electrode layer comprises at least three continuous sub gate electrode layers.

16. The display apparatus of claim 10, wherein the first gate electrode layer comprises a substantially W shape, and wherein the second gate electrode layer partially covers a center of the first gate electrode layer.

17. The display panel of claim 10, wherein a height of the first gate electrode layer is substantially the same as a height of the second gate electrode layer, and wherein a taper angle of the first gate electrode layer and the second gate electrode layer comprise a substantially round shape.

18. A display apparatus comprising:
a first substrate formed of a rigid material;
an insulating layer disposed on the first substrate; and
a switching element disposed on the insulating layer, wherein the switching element comprises:
a flexible substrate, an active layer including a source region and a drain region, wherein the active layer is disposed on the flexible substrate, a gate insulating layer disposed on the active layer;
a gate electrode structure including a plurality of gate electrode layers partially overlapped with each other on the gate insulating layer, an insulating interlayer covering the gate electrode structure, and a source electrode and a drain electrode each disposed on the insulating interlayer, wherein the source electrode and the drain electrode each penetrate the insulating interlayer and the gate insulating layer thereby contacting with the source region of the active layer and the drain region of the active layer, respectively;
a planarization insulating layer disposed on the insulating interlayer, the source electrode and the drain electrode, wherein the planarization insulating layer includes a contact hole exposing the drain electrode;
a first electrode disposed the planarization insulating layer, wherein the first electrode is electrically connected to the drain electrode through the contact hole in the planarization insulating layer;
a pixel definition layer disposed on the planarization insulating layer and partially covering the first electrode;
an organic layer disposed on the first electrode; and
a second electrode covering the organic layer and the pixel definition layer,
wherein the gate electrode structure comprises a first gate electrode layer and a second gate electrode layer that is in direct contact with the first gate electrode layer, and
wherein the second gate electrode layer is disposed on the first gate electrode layer and wherein the second gate electrode layer partially exposes the first gate electrode layer.

19. The display apparatus of claim 18, wherein the second electrode includes at least one material selected from the group consisting of zinc oxide (ZnOx), indium tin oxide (ITO), tin oxide (SnOx), indium oxide (InOx), gallium oxide (GaOx), and indium zinc oxide (IZO).

20. The display apparatus of claim 18, wherein the pixel definition layer includes a material selected from the group consisting of a photoresist, an acrylic resin, a polyimide resin, and silicon oxide (SiOx).

21. The display apparatus of claim 18, wherein the flexible substrate comprises one of a metal foil or a plastic material and wherein the first substrate includes a material selected from the group consisting of glass, quartz, a wafer, a ceramic material, a metal, and a metal oxide.

22. The display apparatus of claim 18, wherein the organic layer is disposed on an area of the first electrode which is not covered by the pixel definition layer in a display region of the display apparatus.

23. The display apparatus of claim 18, wherein the insulating layer disposed on the first substrate includes an isolation layer.

* * * * *